United States Patent [19]

Svendor et al.

[11] 3,945,903

[45] Mar. 23, 1976

[54] SPUTTER-COATING OF GLASS SHEETS OR OTHER SUBSTRATES

[75] Inventors: John S. Svendor; Eugene Shintock, both of Allen Park, Mich.

[73] Assignee: Shatterproof Glass Corporation, Detroit, Mich.

[22] Filed: Aug. 28, 1974

[21] Appl. No.: 501,174

[52] U.S. Cl. ............................... 204/192; 204/298
[51] Int. Cl.² ........................................ C23C 15/00
[58] Field of Search ............. 117/129; 204/192, 298

[56] References Cited
UNITED STATES PATENTS

| | | | |
|---|---|---|---|
| 2,424,353 | 7/1947 | Essig .............................. | 117/129 X |
| 2,475,469 | 7/1949 | Bennett et al. .................... | 117/129 |
| 2,492,682 | 12/1949 | Carpenter et al. ............... | 117/129 X |
| 3,617,463 | 11/1971 | Gregor et al. ..................... | 204/298 |
| 3,620,957 | 11/1971 | Emery et al. ..................... | 204/298 |

OTHER PUBLICATIONS

"Handbook of Thin Film Technology" by Maissel & Glang, McGraw–Hill, N.Y., 1970, pp. 7–50.

*Primary Examiner*—T. Tung
*Assistant Examiner*—Aaron Weisstuch
*Attorney, Agent, or Firm*—William E. Nobbe

[57] ABSTRACT

Means for supporting a glass sheet substrate during the sputter-coating of a thin film of metal or metal-alloy thereon, comprising a rigid metal platen having a major supporting surface, and an overlay for the metal platen consisting of at least one glass plate covering the major supporting surface of the platen and directly supporting thereon the glass sheet substrate during the sputter-coating operations.

4 Claims, 4 Drawing Figures

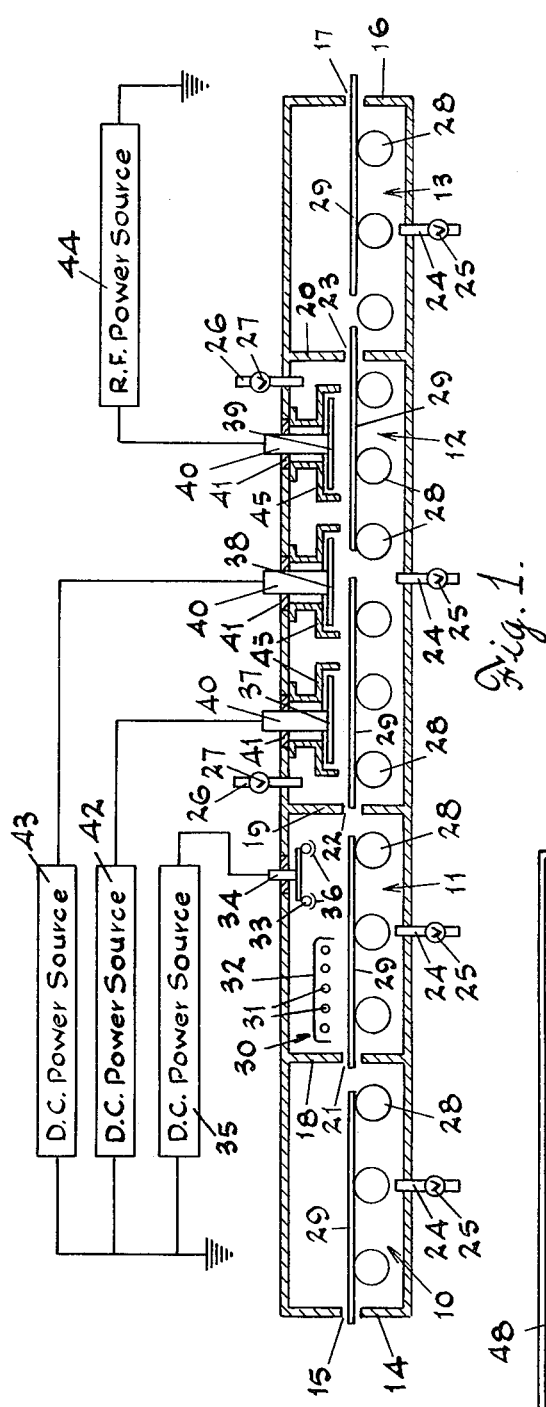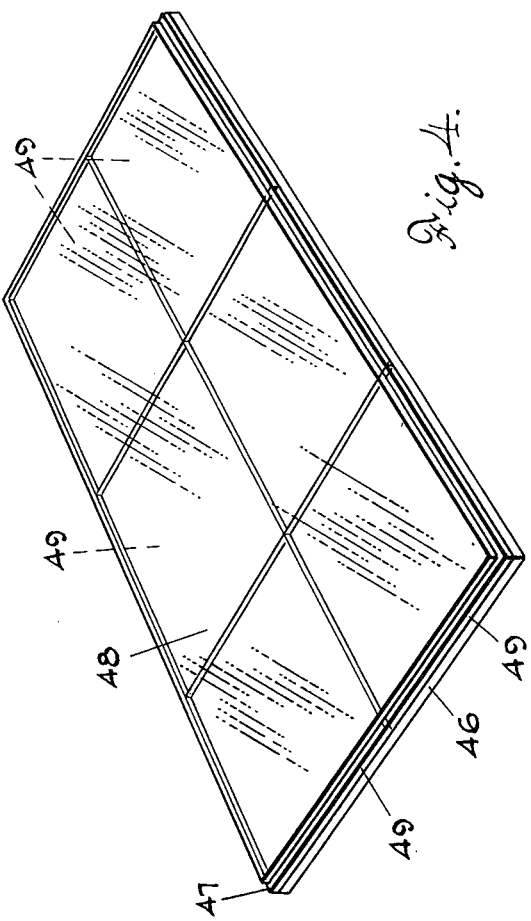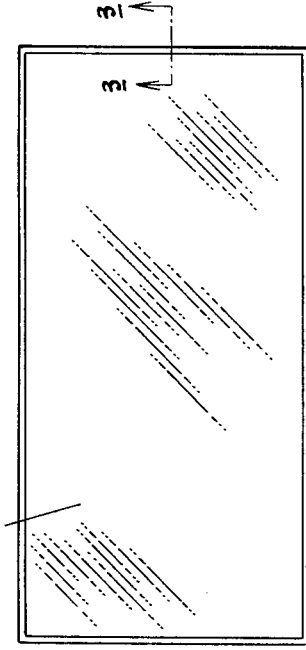

3,945,903

SPUTTER-COATING OF GLASS SHEETS OR OTHER SUBSTRATES

BACKGROUND OF THE INVENTION

The present invention relates to improvements in the coating of substrates of a glassy siliceous material with thin films of a metal or metal-alloy and more particularly to the coating of sheets of glass by the known sputtering or sputter-coating process.

The process of sputter-coating involves ion bombarding a target of the coating material in low-pressure gaseous glow discharge to cause atomic particles of coating material to be dislodged and deposited on the substrate to be coated. One type of apparatus employed for carrying out the process embodies a plurality of aligned, independently controlled contiguous chambers including an entry chamber, a coating chamber and an exit chamber, sputter-coating means in the form of a substantially rectangular cathode mounted horizontally in the upper portion of the coating chamber and having a sheet of a selected coating material secured to the bottom thereof, and conveyor means for moving the substrates (glass sheets) in a horizontally disposed position through the successive chambers and beneath the sputter-coating means such that a continuous film of the selected coating material will be deposited on the substrate.

In one such process, the glass sheets or other substrates to be coated are placed horizontally directly upon a solid metal platen which supports and conveys the sheets through the successive chambers of the coating apparatus. While this method has proven commercially acceptable, the use of metal platens for supporting the glass sheets has sometimes been attendant with certain objections. Although the specific reasons are not fully understood, it is believed that the metal of which the platens is made has a tendency toward outgassing and that these gases comingle with the coating material being deposited resulting in an oxide coating rather than a coating of pure metal. This has undesirable effects on the deposited coating, particularly at the edges or marginal portions of the glass sheet in that the color, as well as the thickness and composition of the coating are adversely affected.

According to the present invention, these objections have been effectively overcome by providing the metal platen with a covering or overlay which serves as a support bed for the glass sheets during the coating operations. It has been found that significant improvement can be obtained in the thickness and composition of the coating, as well as the color of the glass sheet at the edges thereof by overlaying the upper surface of he metal platen with one or more plates of glass and then laying the glass sheets to be coated on the glass overlay and out of direct contact with the metal platen.

The primary object of the invention, therefore, is to provide novel means for supporting the glass sheets during coating such that the sheets will be uniformily coated from edge to edge with a thin film of metal of uniform thickness, composition and color.

With reference to the drawings:

FIG. 1 is a vertical longitudinal section through one form of sputter-coating apparatus with which the present invention may be employed, FIG. 2 is a plan view of a metal platen provided with a covering or overlay for supporting the glass sheets to be coated according to the present invention;

FIG. 3 is a section taken on line 3—3 of FIG. 2, and

FIG. 4 is a modified form of support or overlay for the metal platen.

DESCRIPTION OF THE PREFERRED EMBODIMENTS

The sputter-coating apparatus illustrated in FIG. 1, with which the invention may be employed, comprises four successive, continuous enclosures which define four independently controlled chambers—an entry chamber 10, a heating and cleaning chamber 11, a coating chamber 12 and an exit chamber 13. The chambers are rectangular in shape and the dimensions thereof, especially the height, are kept to a minimum in order to minimize the internal volume and thereby minimize the vacuum pumping required.

Each of the chambers is substantially closed except for an elongated entrance opening and an elongated exit opening. The outer end wall 14 of the entry chamber 10 is provided with an entrance opening 15, while the outer end wall 16 of exit chamber 13 is provided with an exit opening 17. The chambers are also separated by partition walls 18, 19 and 20 provided with similiar openings 21, 22 and 23 respectively. All of the openings are positioned at the same height to allow for ingress and egress of the glass sheet substrates as they are moved into and through the successive chambers. Preferably, quick-opening and closing vacuum-tight closures are provided over at least some of the elongated openings to reduce the vacuum pumping requirements. These closures are open when a piece of glass is moved through the opening and closed when no glass is in the opening.

Each of the chambers is provided with at least one outlet tube 24, preferably located at the bottom of the chamber. Each tube communicates with a vacuum pump (not shown) and a valve 25 is provided on each tube to independently control the pressure within each of the chambers. Inlet tubes 26 extend through the top of the coating chamber and communicate with an inert gas source, preferably argon. A valve 27 is provided on each tube 26 to control the flow of gas into the coating chamber.

Conveyor means such as rollers 28 are located in the lower portion of all of the chambers to transport the substrates 29 to be coated through the sequence of chambers. The rollers are driven by suitable drive means (not shown) preferably located outside the chamber.

Heating means 30, comprising elongated, tubular radiation heaters 31, are mounted in the upper portion of the chamber 11. These heaters are preferably high-intensity radiation heaters and a reflector 32, mounted above the heaters, is used to concentrate the heat on the passing substrates 29. The substrates are heated prior to coating to promote outgassing and thereby attain additional surface cleaning and improved adherence of the coating. A glow-discharge cleaning electrode 33, in the form of a closed loop, is located at the top of chamber 11. The electrode is supported by a rod 34 and voltage is applied to the electrode by the high-voltage D.C. power source 35. One side of the source is grounded and the other side thereof is connected to the rod 34. Shields 36 are positioned below the electrode and are just large enough to prevent the substrates from "seeing" the electrode as they pass through the chamber. The electrode is operated as an ordinary sputtering electrode but the shields prevent the electrode material from being deposited on the substrates. The ionized ions of the gas will bombard the surfaces of the substrates to clean them but no sputtering is deposited.

Sputter-coating cathodes 37, 38 and 39, in the form of elongated, rectangular plates of the selected coating material, are mounted at the top of the coating chamber 11 by means of electrically conductive support rods 40 which pass through insulating bushings 41. The cathodes 37 and 38 are used to deposit a thin film of a metal such as nickel or nickel-base alloy and therefore voltage is applied to these cathodes by high-voltage D.C. power sources 42 and 43 respectively. The cathode 39 may be used to deposit a thin protective layer of a siliceous material such as Pyrex glass by radio-frequency sputtering and therefore voltage is applied to cathode 39 by a high-voltage radio-frequency power source 44. Grounded shields 45 surround the cathodes 37, 38 and 39 and the support rods 40 to prevent sputtering on the back side of the cathodes and the rods. All power sources are preferably grounded to the apparatus such that the apparatus will act as the anode for the cleaning and sputtering operations.

In practice, one or more cathodes may be used in he coating chamber. Several cathodes of different materials may be applied consecutively as, for example, by making cathode 37 of one metal, cathode 38 of a different metal, and cathode 39 of a siliceous material. Also, the coating chamber can be increased in length and a greater number of cathodes of the same material used to increase the deposition rate, and therefore the production rate.

In operation, the glass sheet substrates to be coated are first cleaned by a conventional washing operation and are then passed into the entry chamber 10, with the smooth continuous surface to be coated facing upward. The vacuum pumping in the entry chamber removes most of the air, moisture, and other contaminates which leak in through the entrance opening. The substrates 29 are moved by the rollers 28 to the heating and cleaning chamber 11 where they are heated by the heaters 31 and then cleaned by the cleaning electrode 33. The substrates then move at a controlled speed into the coating chamber 12 where a continuous film of the selected coating material or materials is sputtered on the clean upper surfaces thereof. As stated above, the cathodes 37 and 38 are preferably used to deposit a reflective film of metal, such as nickel or nickel-alloy, while the cathode 39 is used to radio-frequency sputter-coat an overlying layer of siliceous material, such as quartz or Pyrex. After being coated, the substrate moves into the exit chamber 13 where it is cooled before being removed from the apparatus through the opening 17.

In the sputter-coating of glass sheet substrates involving an apparatus of the general character described above, it has been customary to horizontally support the glass sheets to be coated directly upon the rollers 28, or other conveying means, during the coating operations. In another process, the glass sheets to be coated are supported horizontaly on a rigid metal platen which carries them through the coating apparatus, and it is with this type of sheet supporting means that the present invention is particularly concerned.

Platens formed of magnesium have been used with considerable success for supporting the glass sheets during coating, although platens of other metals can also be used, including steel, aluminum, titanium and copper. However, the use of metal platens has not heretofore been completely free of objection in that there has sometimes been a tendency for the metal to outgas during the coating operation and these gases, mixing with the metal particles being deposited on the glass sheet, tend to contaminate the metal resulting in the coating on the marginal or edge portions of the glass sheet being different from the coating over the major surface area of the sheet in both density and composition, as well as color.

After various ways and means were tried to alleviate this condition without success, it was discovered that it could be effectively overcome by providing the metal platen with a special type of covering or overlay to form a bed on which the glass sheet could be supported and thus kept out of direct contact with the metal platen itself.

Such an arrangement is shown in FIGS. 2 and 3 of the drawings, in which the upper surface of the metal platen 46 is provided with a covering or overlay of a siliceous material consisting of a single plate of glass 47 which is coextensive in size with the upper surface of the platen so that the marginal portions of the platen are not exposed to the sputtering means. The glass sheet substrate 48 to be coated is then laid directly upon the glass support plate 47 and carried by the platen through the coating apparatus disclosed in FIG. 1. Significant improvement has been attained by this arrangement in the uniformity of the sputtered metal coating from edge to edge of the glass sheet substrate both as to thickness and composition, as well as color.

Although it is preferred that the glass plate overlay 47 be coextensive in size with the metal platen 46, it may, if desired, be of slightly larger dimensions with the same effectiveness. The glass used for the overlay may be conventional silicate glass including window glass, plate glass and float glass. The thickness of the glass plate overlay may also vary although plates of ¼ inch thickness have been used successfully.

Although it is usually preferred that a single plate of glass be used as the overlay for the platen, a plurality of individual glass plates 49 may be used, as shown in FIG. 4, with the plates being in closely abutting edge to edge relation to completely cover the platen.

It is to be understood, of course, that the words used herein to describe the invention are words of description rather than of limitation and that the scope of the invention is to be limited only insofar as set forth in the appended claims.

We claim:

1. In combination with apparatus for sputter-coating a thin film of metal on a glass sheet substrate including a coating chamber, sputter-coating means mounted in the upper portion of said chamber, a metal platen having a major upper supporting surface, and means for conveying the metal platen into, through and out of said coating chamber, the improvement which consists (of) in providing an overlay for the metal platen formed of a (siliceous material) single plate of glass freely supported on and completely covering the upper major supporting surface of the platen in contact therewith and (directly supporting thereon) adapted to freely support the glass sheet substrate thereon and in contact therewith during the sputter-coating (operation) of the upper surface of the glass sheet substrate.

2. The improvement of claim 1, in which the overlay for the metal platen consists of a plurality of glass plates arranged in abutting edge to edge relation to completely cover the major supporting surface of the platen.

3. In the method of sputter-coating a thin film of metal on a glass sheet substrate, wherein said substrate is supported horizontally on the upper surface of a rigid metal platen and conveyed through a coating chamber, the improvement comprising covering the upper surface of said platen with an overlay consisting of a single plate of glass freely supported thereon in direct contact therewith, and then freely supporting the glass sheet substrate to be coated on said glass plate overlay in direct contact therewith.

4. The improvement of claim 3, in which the overlay for the metal platen consists of a plurality of plates of glass arranged in abutting edge to edge relation freely supported on the upper surface of said platen and freely supporting the glass sheet substrate to be coated.

* * * * *

UNITED STATES PATENT AND TRADEMARK OFFICE
CERTIFICATE OF CORRECTION

PATENT NO. : 3,945,903
DATED : March 23, 1976
INVENTOR(S) : John S. Svendor; Eugene Shintock It is certified that error appears in the above-identified patent and that said Letters Patent are hereby corrected as shown below:

Claim 1, line 8, cancel "(of)"; line 9, cancel "(siliceous material)"; line 12, cancel "(directly supporting thereon)"; lines 14 and 15, cancel "(operation)".

Signed and Sealed this

Thirty-first Day of August 1976

[SEAL]

Attest:

RUTH C. MASON
Attesting Officer

C. MARSHALL DANN
Commissioner of Patents and Trademarks